United States Patent
Black et al.

(10) Patent No.: US 8,860,199 B2
(45) Date of Patent: Oct. 14, 2014

(54) MULTI-DIE PROCESSOR

(75) Inventors: Bryan P. Black, Austin, TX (US);
Nicholas G. Samra, Austin, TX (US);
M. Clair Webb, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 12/365,171

(22) Filed: Feb. 4, 2009

(65) Prior Publication Data

US 2009/0138688 A1    May 28, 2009

Related U.S. Application Data

(62) Division of application No. 10/738,680, filed on Dec. 16, 2003, now abandoned.

(51) Int. Cl.
*H01L 21/48* (2006.01)
*H01L 23/48* (2006.01)
*H01L 25/065* (2006.01)
*G06F 15/78* (2006.01)
*H01L 23/00* (2006.01)

(52) U.S. Cl.
CPC ....... *G06F 15/7832* (2013.01); *H01L 2224/131* (2013.01); *H01L 2224/14181* (2013.01); *H01L 2224/13025* (2013.01); *H01L 25/0657* (2013.01); *H01L 24/16* (2013.01); *H01L 2224/73253* (2013.01); *H01L 2224/16145* (2013.01); *H01L 2924/00013* (2013.01); *H01L 2225/06562* (2013.01); *H01L 2225/06565* (2013.01); *H01L 2225/06513* (2013.01)

USPC .......................... 257/686; 257/777; 438/109

(58) Field of Classification Search
USPC .................. 257/684, 723, 777, 778, E23.178
See application file for complete search history.

(56) References Cited

U.S. PATENT DOCUMENTS

| | | | |
|---|---|---|---|
| 5,376,825 A | | 12/1994 | Tukamoto et al. |
| 5,909,587 A | * | 6/1999 | Tran ................................ 712/1 |
| 6,093,969 A | * | 7/2000 | Lin ................................ 257/777 |
| 6,229,158 B1 | | 5/2001 | Minemier et al. |
| 6,411,561 B2 | | 6/2002 | Ayukawa et al. |
| 6,605,875 B2 | | 8/2003 | Eskildsen |
| 6,844,624 B1 | * | 1/2005 | Kiritani ........................ 257/723 |
| 6,917,219 B2 | | 7/2005 | New |

FOREIGN PATENT DOCUMENTS

| | | |
|---|---|---|
| JP | 04-196159 A | 7/1992 |
| JP | 9-503622 | 4/1997 |
| JP | 2000-227457 A | 8/2000 |
| WO | 01/28003 A1 | 4/2001 |
| WO | 2005/062190 A1 | 7/2005 |

OTHER PUBLICATIONS

Office Action received for Chinese Patent Application No. 200410095565.9, mailed on Jul. 6, 2007, 8 pages of English translation.

(Continued)

*Primary Examiner* — Sonya D McCall Shepard
(74) *Attorney, Agent, or Firm* — Trop, Pruner & Hu, P.C.

(57) ABSTRACT

Disclosed are a multi-die processor apparatus and system. Processor logic to execute one or more instructions is allocated among two or more face-to-faces stacked dice. The processor includes a conductive interface between the stacked dice to facilitate die-to-die communication.

16 Claims, 17 Drawing Sheets

(56) References Cited

OTHER PUBLICATIONS

Office Action received for Chinese Patent Application No. 200410095565.9, mailed on Jul. 4, 2008, 5 pages including 2 pages of English translation.
Office Action received for Japanese Patent Application No. 2006-543849, mailed on Jun. 9, 2009, 4 pages including 2 pages of English translation.
Office Action received for Japanese Patent Application No. 2006-543849, mailed on Jun. 8, 2010, 7 pages including 4 pages of English translation.
International Search Report and Written Opinion for PCT Patent Application No. PCT/US2004/039236, mailed on Mar. 22, 2005, 14 pages.
International Preliminary Report on Patentability for PCT Patent Application No. PCT/US2004/039236, mailed on Jun. 29, 2006, 9 pages.
Deng et al., "Physical Design of the 2.5D Stacked System", Proceedings of the 21st International Conference on Computer Design (ICCD'03), Oct. 13-15, 2003, pp. 211-217.
Deng et al., "A feasibility study of 2.5D system integration", Proceedings of the IEEE 2003 Custom Integrated Circuits Conference, Sep. 21-24, 2003, pp. 667-670.
Dufresne et al., "Hybrid assembly technology for flip-chip-on-chip (FCOC) using PBGA laminate assembly", 2000 Proceedings 50th Electronic Components and Technology Conference, May 21-24, 2000, pp. 541-548.
Deng et al., "Interconnect characteristics of 2.5-D system integration scheme", Proceedings of the 2001 international symposium on Physical design (ISPD '01), Apr. 1-4, 2001, pp. 171-175.
Pogge, "The Next Chip Challenge: Effective Methods for Viable Mixed Technology SoCs", 39th Proceedings of Design Automation Conference, 2002 (DAC 2002), Jun. 10-14, 2002, pp. 84-87.
Joyner et al., "Opportunities for Reduced Power Dissipation Using Three-Dimensional Integration", Proceedings of the IEEE 2002 International Interconnect Technology Conference, 2002, pp. 148-150.
Mayega et al., "3D direct vertical interconnect microprocessors test vehicle", Proceedings of the 13th ACM Great Lakes symposium on VLSI (GLSVLSI '03), Apr. 28-29, 2003, pp. 141-146.
Zeng et al., "Wafer-level 3D manufacturing issues for streaming video processors", IEEE Conference and Workshop on Advanced Semiconductor Manufacturing, 2004 (ASMC '04), May 2004, pp. 247-251.
Japanese Patent and Trademark Office, Office Action mailed Jan. 15, 2013 in Japanese application No. 2010-225469.

\* cited by examiner

Planar floor plan

Planar floor plan

Planar floor plan

Planar floor plan

Planar floor plan

Planar floor plan

MULTI-DIE PROCESSOR

CROSS REFERENCE TO RELATED APPLICATIONS

This application is a Divisional of U.S. patent application Ser. No. 10/738,680, entitled "Multi-Die Processor," by Bryan P. Black, filed on Dec. 16, 2003 now abandoned.

BACKGROUND

1. Technical Field

The present disclosure relates generally to information processing systems and, more specifically, to processors whose logic is partitioned among a plurality of stacked dice.

2. Background Art

Electronic devices such as cellular telephones and notebook computers typically contain a number of integrated circuit (IC) packages mounted to a printed circuit board (PCB). IC packages typically include a single IC die on a substrate or leadframe. The die and substrate are encapsulated in a material such as plastic. The encapsulated packages are then mounted to another substrate such as a PCB. Various packaging approaches have been employed to improve performance for such electronic devices.

Multichip modules (MCM) are IC packages that can contain two or more "bare" or unpackaged integrated circuit dice interconnected on a common substrate. The size of the electronic device that uses MCMs can be reduced because MCMs typically have a number of individual IC dice mounted within a single package in a laterally adjacent manner.

System on a Chip (SoC) technology is the packaging of most or all of the necessary electronic circuits and parts for a "system" (such as a cell phone or digital camera) on a single IC die. For example, a system-on-a-chip for a sound-detecting device may include an audio receiver, an analog-to-digital converter, a microprocessor, memory, and input/output control logic on a single IC die.

Another type of IC package configuration that attempts to decrease the footprint and volume of the IC package is known as a Stacked Chip Scale Package (Stacked-CSP). The Stacked-CSP is essentially a space-efficient MCM, where multiple die are stacked (in a face-to-back orientation) and integrated into a single package. Stacked-CSP packaging allows manufacturers of mobile phones and other portable devices to make their products smaller by vertically stacking heterogeneous dice, such as stacking flash and SRAM (Static Random Access Memory) dice, within a single package. By utilizing Stacked-CSP products that vertically mount two or more heterogeneous IC dice in a single package, wireless devices may be generated to have lower cost, weight and board space than devices made of traditional single-die packages.

BRIEF DESCRIPTION OF THE DRAWINGS

The present invention may be understood with reference to the following drawings in which like elements are indicated by like numbers. These drawings are not intended to be limiting but are instead provided to illustrate selected embodiments of an apparatus and system for a multiple-die processor for which logic of the processor is partitioned among the multiple die.

DETAILED DESCRIPTION

Described herein are selected embodiments of a multi-die processor apparatus and system. In the following description, numerous specific details such as inter-component communication mechanisms, specified pipeline stages, overlap configurations for split logic, and the like have been set forth to provide a more thorough understanding of the present invention. It will be appreciated, however, by one skilled in the art that the invention may be practiced without such specific details. Additionally, some well-known structures, circuits, and the like have not been shown in detail to avoid unnecessarily obscuring the present invention.

Disclosed herein is a packaging approach to stack multiple dice that, together, implement a processor device in a single package. For example, efficiencies in processor performance (as measured, for instance, by instructions per clock cycle) and heat and power management may be realized by splitting the logic of a processor core among two stacked dice that work together to cooperatively execute instructions.

Figure 1:
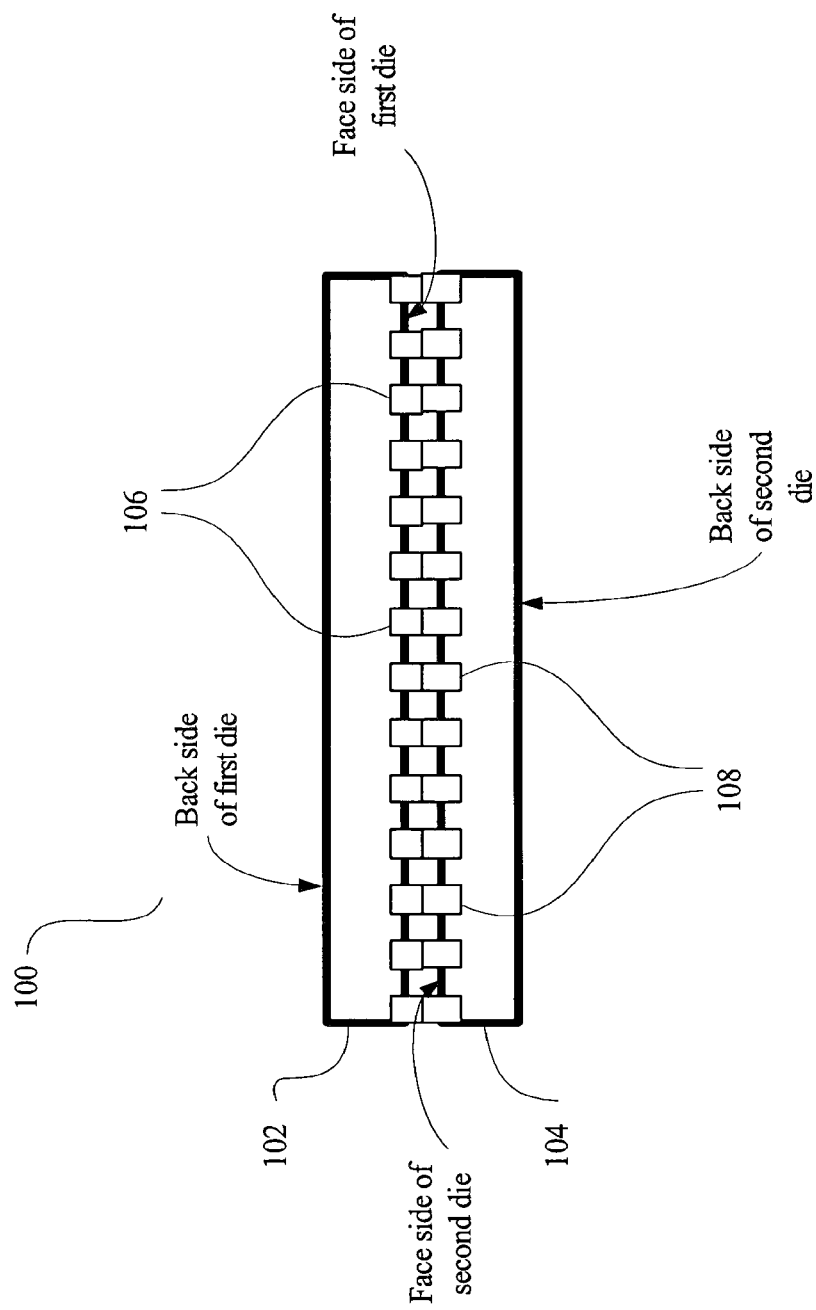
FIG. 1 is a block diagram of at least one embodiment of a multi-die processor exhibiting disclosed features.

FIG. 1 is a block diagram of a multi-die processor core 100 to execute one or more instructions. The processor core may be a general or special purpose microprocessor, a digital signal processor, a graphics processor, a communications processor, a network processor or any other processor that executes one or more instructions. FIG. 1 illustrates that the processor package 100 includes a first die 102 and a second die 104. The first and second dice operate cooperatively to execute instructions. That is, neither die 102, 104 is a fully functional processor; the functionality of a processor is "split" between the two dice 102, 104.

At least one embodiment of each of the first die 102 and second die 104 has a face side and a back side. By "face" it is intended to refer to the side of the die with an integrated circuit formed on it. This face side may be referred to as the side of the die having active silicon. The "back side" of a die is the side having inactive matter (such as silicon substrate) that may be coupled to another structure, such as a heat sink, C4 I/O bumps, a substrate, or the like.

From FIG. 1 it can be seen that at least one embodiment of the first die 102 and second die 104 are coupled together in a face-to-face orientation. Rather than epoxy or other adhesive-based coupling mechanism, the face sides of the first die 102 and second die 104 may be coupled together via a conductive interface. For at least one embodiment, conductive elements 106 on the face side of the first die 102 are coupled to conductive elements 108 on the face side of the second die 104. For example, corresponding conductive elements 106, 108 may be copper vias that may be bonded together in order to create a conductive inter-die interface (see 275, FIG. 2)

Figure 6:
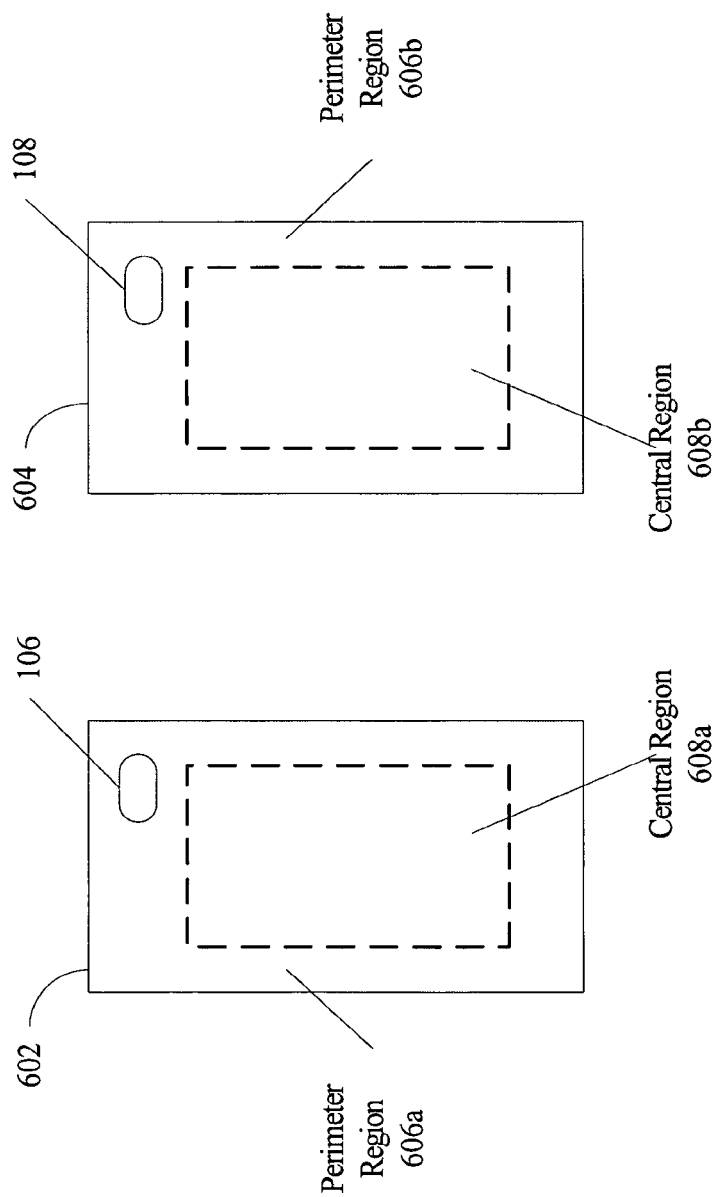
FIG. 6 is a block diagram illustrating conductive elements on the face side of multiple dice.

Brief reference to FIG. 6 further illustrates the range of choices for placement of conductive elements 106, 108 on a first die 602 and second die 604. FIG. 6 illustrates the face sides a first die 602 and a second die 604. It should be noted that the conductive elements 106, 108 may be placed at any location on the face of the respective dice 602, 604. Although FIG. 6 illustrates a plurality of conductive elements 106, 108 covering the entire face of each die 602, 604, one of skill in the art will recognize that any subset of the area of the face of each die 602, 604 may include conductive elements 106, 108.

FIG. 6 illustrates that each die 602, 604 has a perimeter region 606 and a central region 608. The conductive elements 106 for the first die 602 may be placed within the central region of the die 608a and/or along the perimeter region of the die 606a. Similarly, the conductive elements 108 for the second die 604 may also be placed anywhere along the face of the die 604, including the central region and/or the perimeter region of the die 604. As a result, there are no "keep out" areas on the face side of either die. Accordingly, the first and second dice 602, 604 may be of the same size and shape. They may thus overlap each other completely when stacked. In other embodiments, different sizes and shapes may be used and/or overlap may be more limited or partial.

Figure 2:
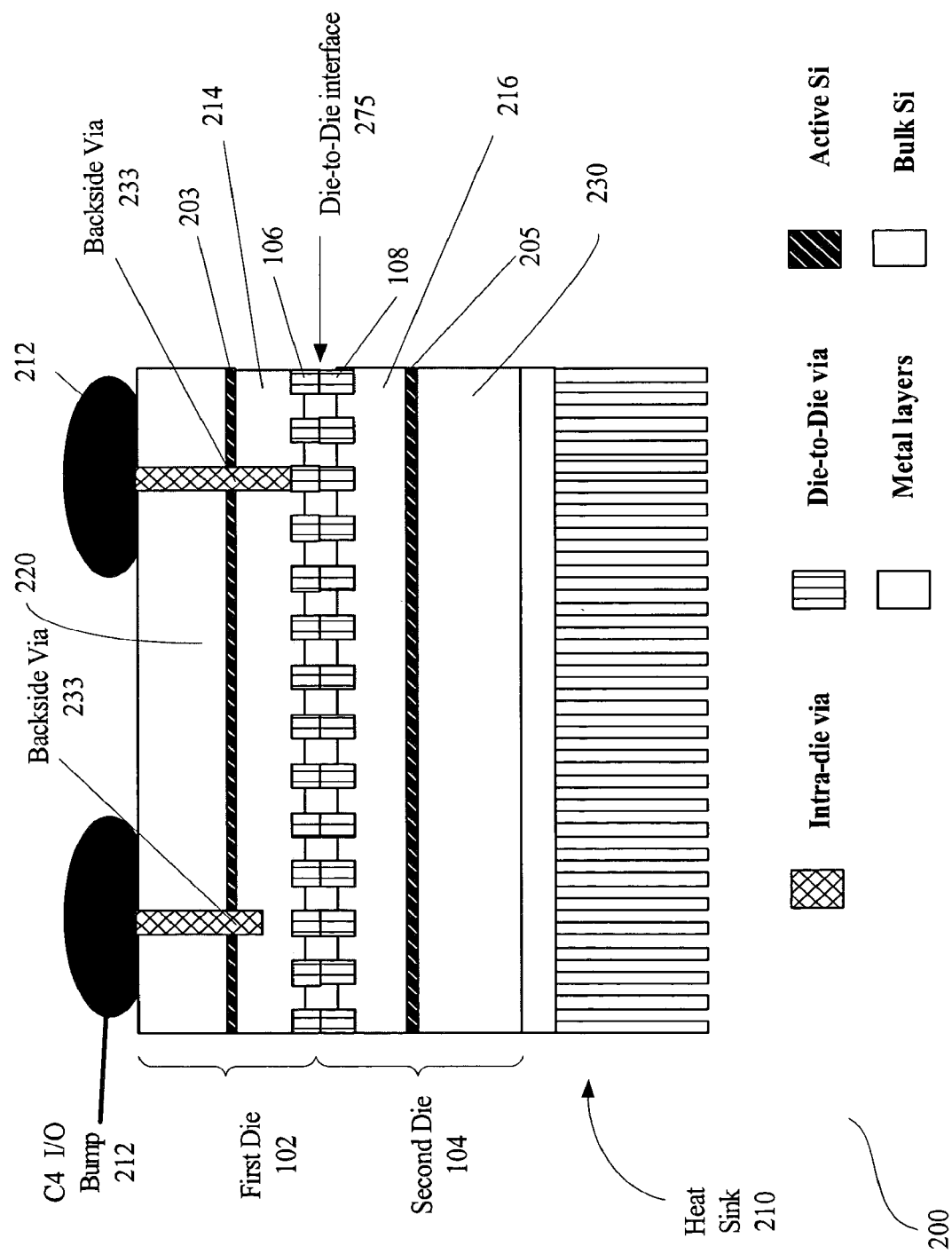
FIG. 2 is a block diagram illustrating further detail for at least one embodiment of a multi-die processor.

FIG. 2 is a block diagram illustrating further detail for at least one embodiment 200 of a multi-die processor made in accordance with disclosed techniques. The face side of first die 102 includes an active silicon layer 203 and one or more metal layers 214. The face side of second die 104 also includes an active silicon layer 205 and one or more metal layers 216.

FIG. 2 further illustrates that the back side of each of the dice 102, 104 includes a layer of inactive bulk silicon 220, 230, respectively. The back side of first die 102 may also include one or more backside vias 233 to provide a communication pathway from the active silicon 203 on the face of the first die 102 to metal input/output (I/O) solder bumps 212. The vias 233 may be made of, for example, copper.

Figure 17:
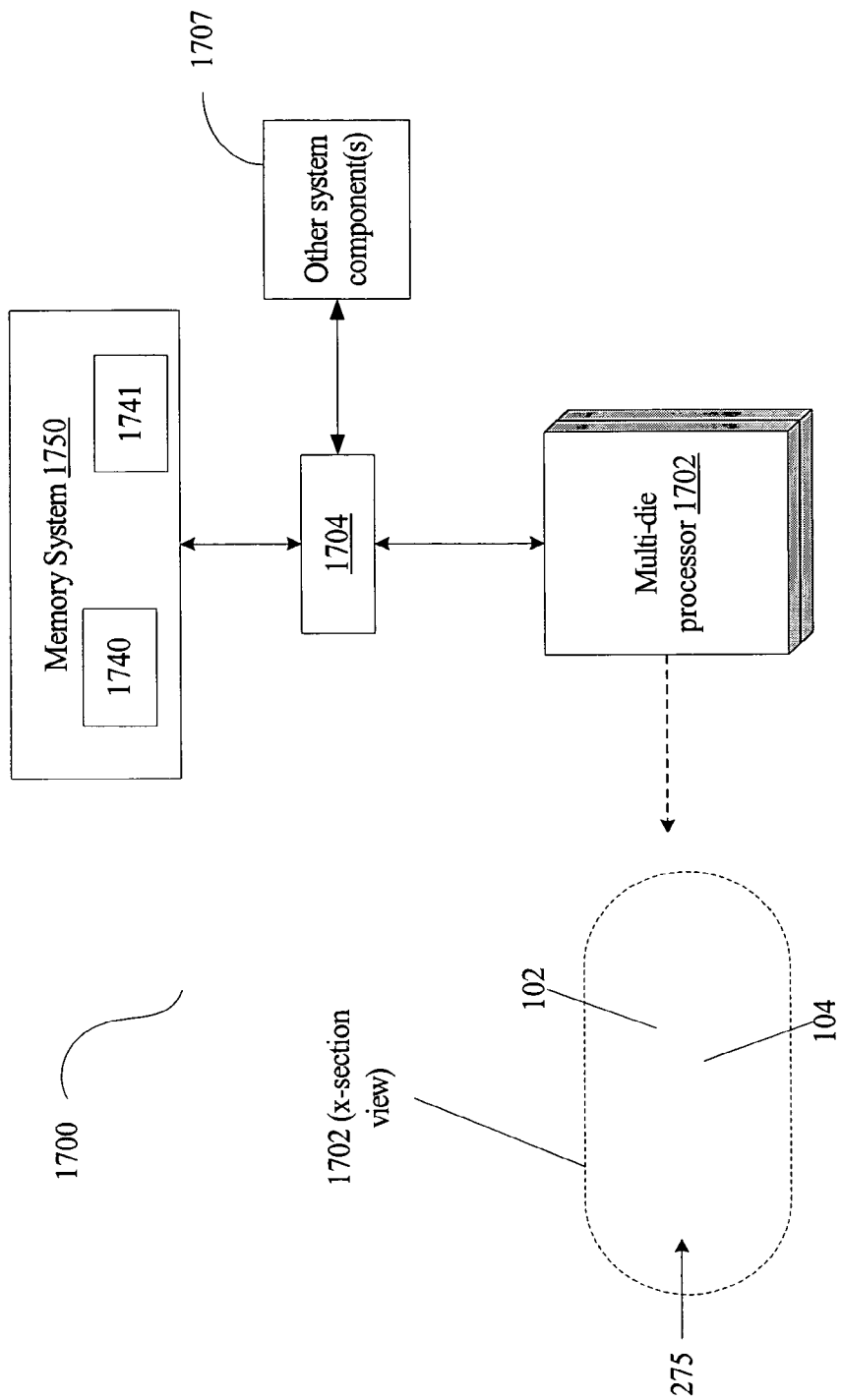
FIG. 17 is a block diagram illustrating at least one embodiment of a processing system that includes a multi-die processor.

The I/O 212 bumps provide a means for communicating with structures outside the multi-die processor 200, such as an interface portion of a processing system (see 1704, FIG. 17). The interface portion may be coupled to the I/O bumps 212, which may reside on both dice. Alternatively, the I/O bumps 212 may reside on only one of the two dice, such as on the first die 102 as illustrated in FIG. 2. Accordingly, the interface portion may be coupled to only one of the multiple dice. The interface portion, in communication with the I/O bumps 212, may provide a mechanism for the multi-die processor 200 to communicate with other components of a processing system. For example, the interface portion and the I/O bumps 212 may facilitate communication between the processor 200 and a memory system (see 1750, FIG. 17) in order to process memory access requests from the processor.

FIG. 2 illustrates that the back-side layer of inactive silicon 230 for the second die 104 may be coupled to a heat sink 210.

Figure 3:
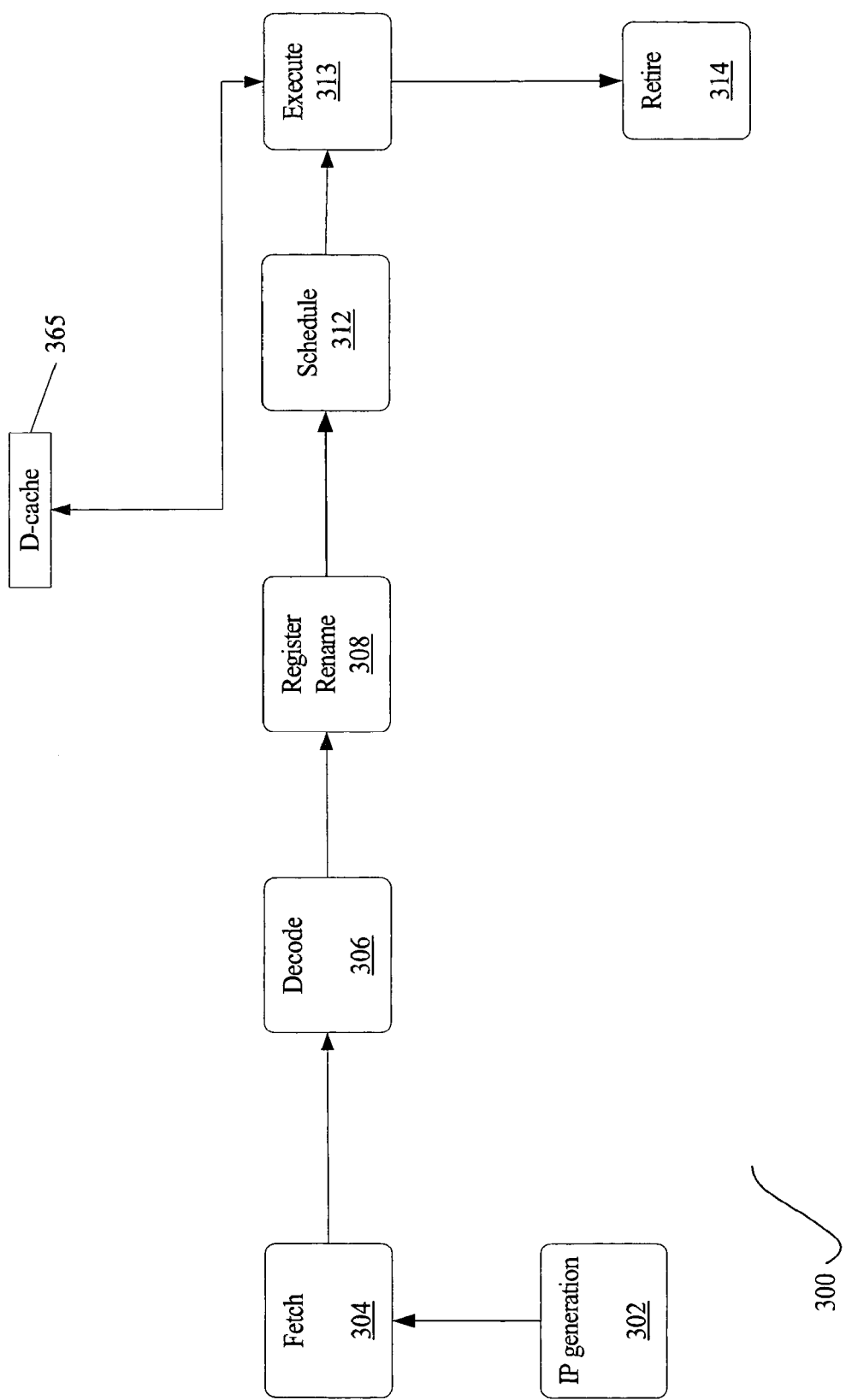
FIG. 3 is a data flow diagram illustrating at least one embodiment of an illustrative instruction execution pipeline.

FIG. 3 is a block flow diagram illustrating a sample execution pipeline 300 for a processor. The illustrative execution pipeline 300 illustrated in FIG. 3 includes the following stages: instruction pointer generation 302, instruction fetch 304, instruction decode 306, register rename 308, scheduling 312, execution 313, and instruction retirement 314. The pipeline 300 illustrated in FIG. 3 is illustrative only; the techniques described herein may be used on any processor. For an embodiment in which the processor utilizes an execution pipeline 300, the stages of a pipeline 300 may appear in different order than that depicted in FIG. 3 or may be split into many more, different or other stages.

The techniques disclosed herein may be utilized on a processor whose pipeline 300 may include different or additional pipeline stages to those illustrated in FIG. 3. For example, alternative embodiments of the pipeline 300 may include additional pipeline stages for rotation, expansion, exception detection, etc. In addition, a EPIC-type (Explicitly Parallel Instruction Computing) processor may include different pipeline stages, such as a word-line decode stage, architectural rename stage, etc., than appear in the pipeline for a processor that includes variable-length instructions in its instruction set. Also, some processors may not include a decode phase 306 to decode instructions into micro-operations.

Figure 4:
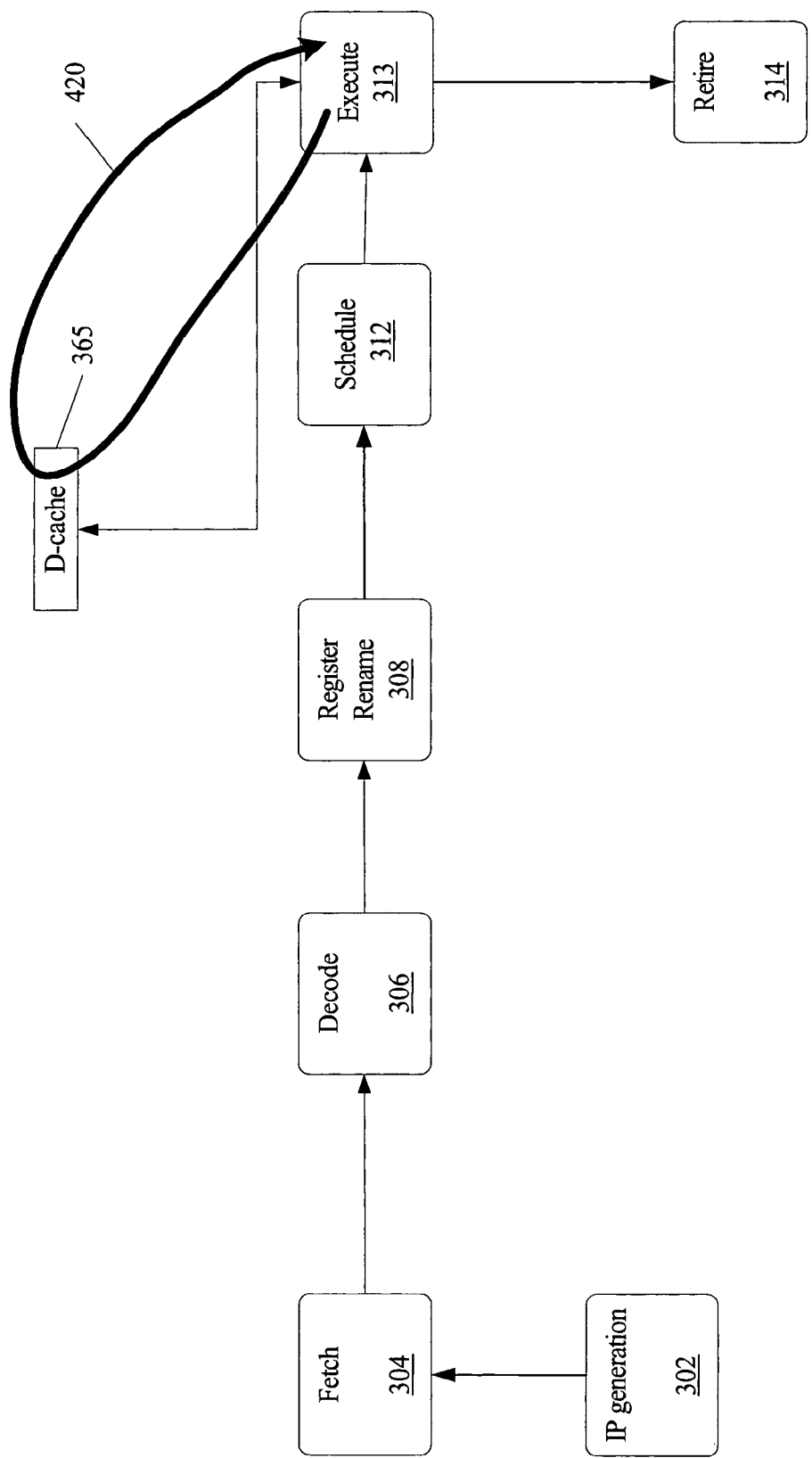
FIG. 4 is a data flow diagram illustrating a load access data path.
Figure 5:
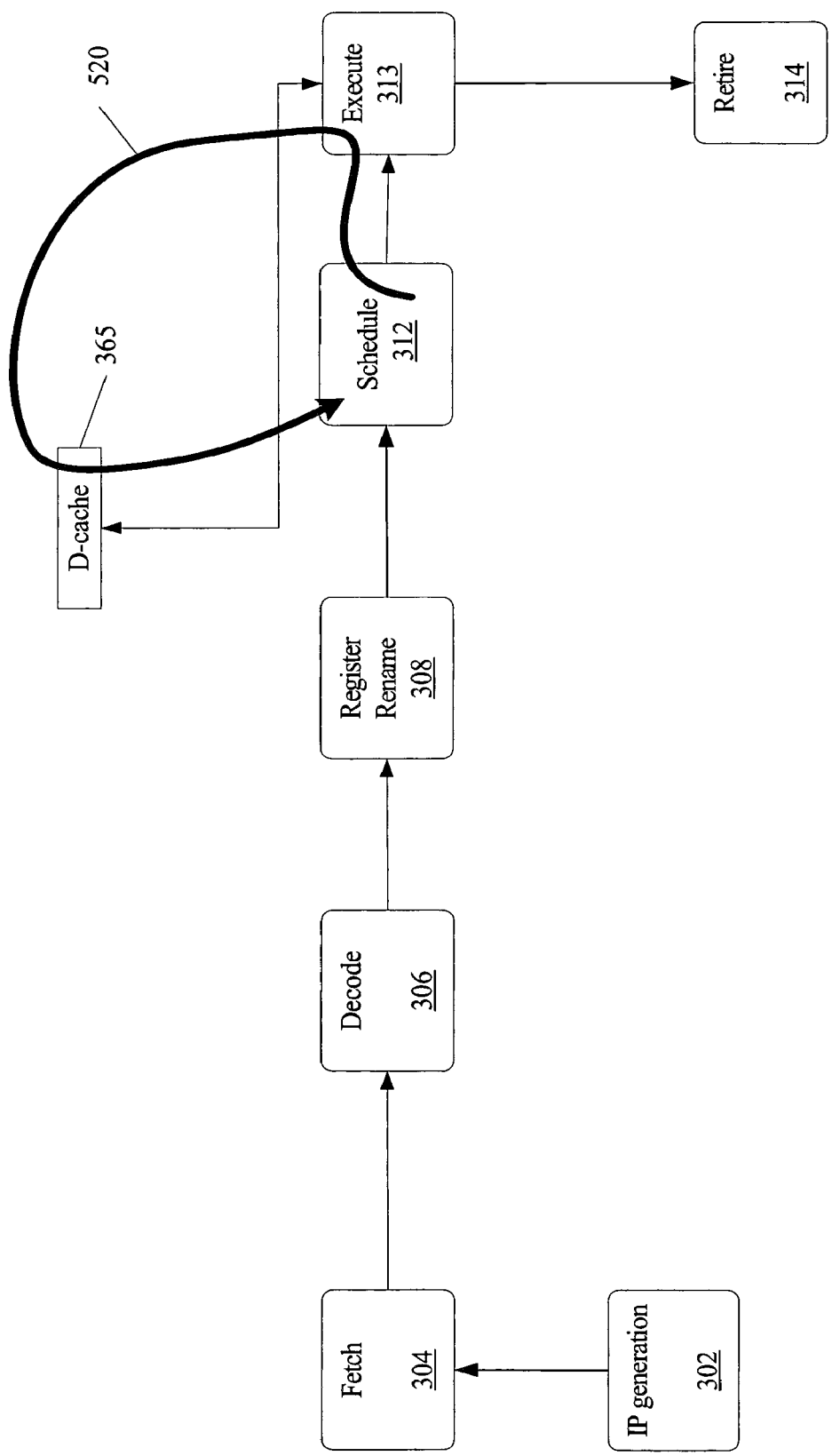
FIG. 5 is a data flow diagram illustrating a schedule-execute data path.

FIGS. 4 and 5 illustrate that, during execution of an instruction, various data paths through the pipeline 300 may be followed. Some of these paths may constitute performance-critical data loops. For example, FIG. 4 illustrates that, during execution of a load instruction, a load access data path 420 may be followed from a load/store execution unit (not shown) during an execution pipeline stage 313, to a data cache 365. Such load access data path 420 is a performance-critical loop because of data dependencies inherent in software code— some later instructions cannot be executed until data from an earlier load instruction is retrieved from memory and is made available to the later instruction.

Similarly, other performance-critical loops may occur during a processor's execution of instructions. For example, FIG. 5 illustrates that a schedule-execute data path 520 may also be a performance-critical loop. Again, such schedule-execute data path 520 may be a performance-critical loop due to data dependencies inherent in software code—some later instructions (consumers) cannot be executed until an earlier instruction (producer) has calculated a register value to be used by the consumer instruction.

A multi-die processor, such as, for example, the embodiments 100, 200 illustrated in FIGS. 1 and 2, respectively, may be partitioned among multiple dice such that critical data paths are shortened. For example, the load access path 420 and the schedule-execute path 520 illustrated in FIGS. 4 and 5, respectively, may be shortened by judicious partitioning and allocation of processor logic among a first and second face-to-face die.

Figure 7:
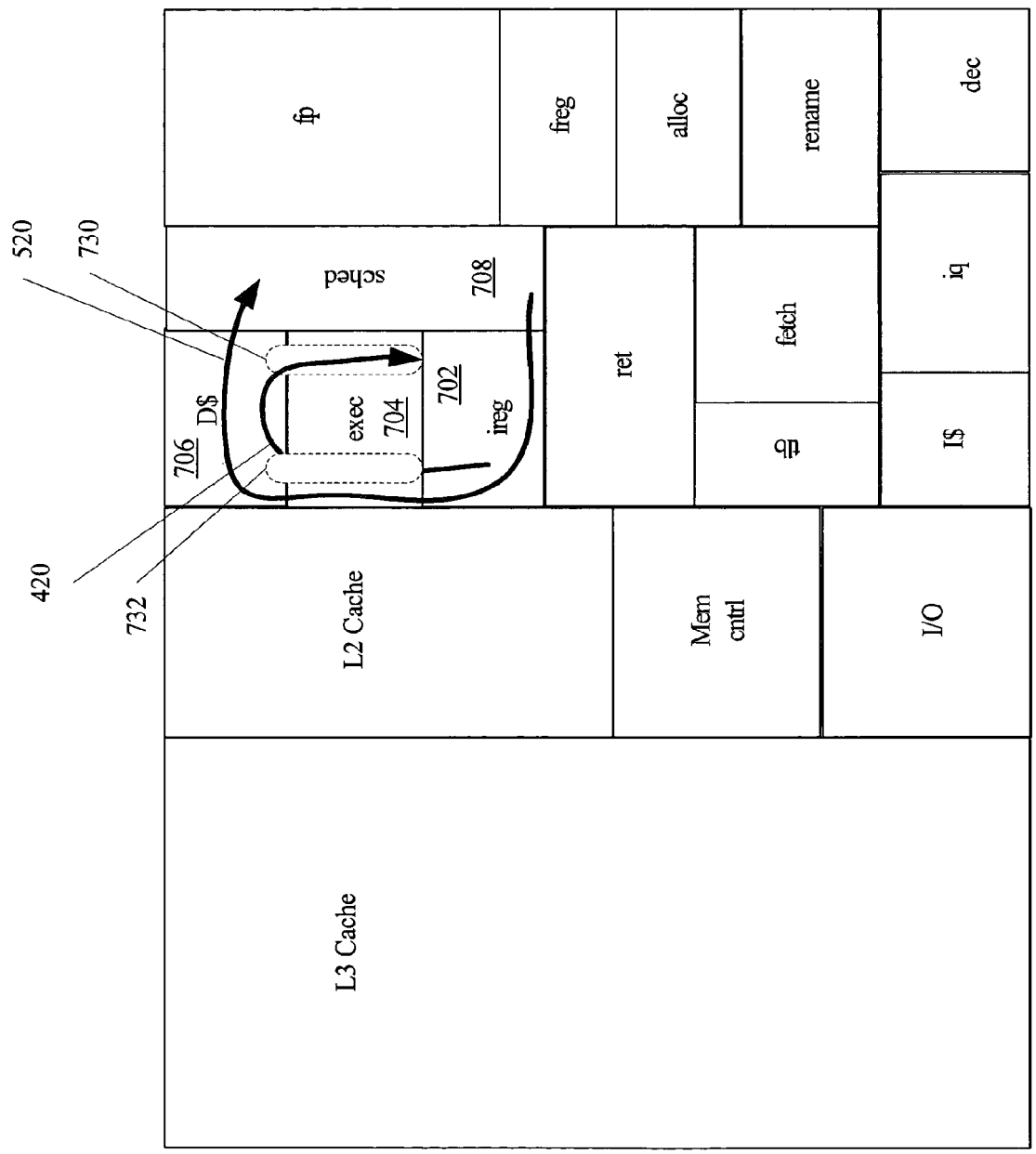
FIG. 7 is a block diagram illustrating a sample scalar floor plan for logic of an illustrative scalar single-die processor.

FIG. 7 illustrates, for example, a sample scalar processor layout wherein logic of the processor is allocated to a single die 700. FIG. 7 illustrates the data paths 420, 520 illustrated in FIGS. 4 and 5, respectively. The load access data path 420 begins at the general register file 702, proceeds through a load/store execution unit in the execution unit block of logic 704, and proceeds to the data cache 706 to obtain the load data. The time delay to traverse the execution unit logic 704 to get to the data cache 706 is indicated by reference numeral 732. Once the load data is retrieved from the data cache 706, the data is returned to the front of the execution logic 704. The time delay to get the desired load data from the data cache 706 to the front of the execution logic 704 is indicated by reference numeral 730.

Regarding the schedule-execute data path 520, FIG. 7 illustrates such path 520 on the sample scalar processor logic 700. FIG. 7 illustrates that data for such path 520 starts at schedule logic 708, proceeds through the general register file 702, the execute logic 704, the data cache 706, and back to the scheduling logic 708.

Figure 8:
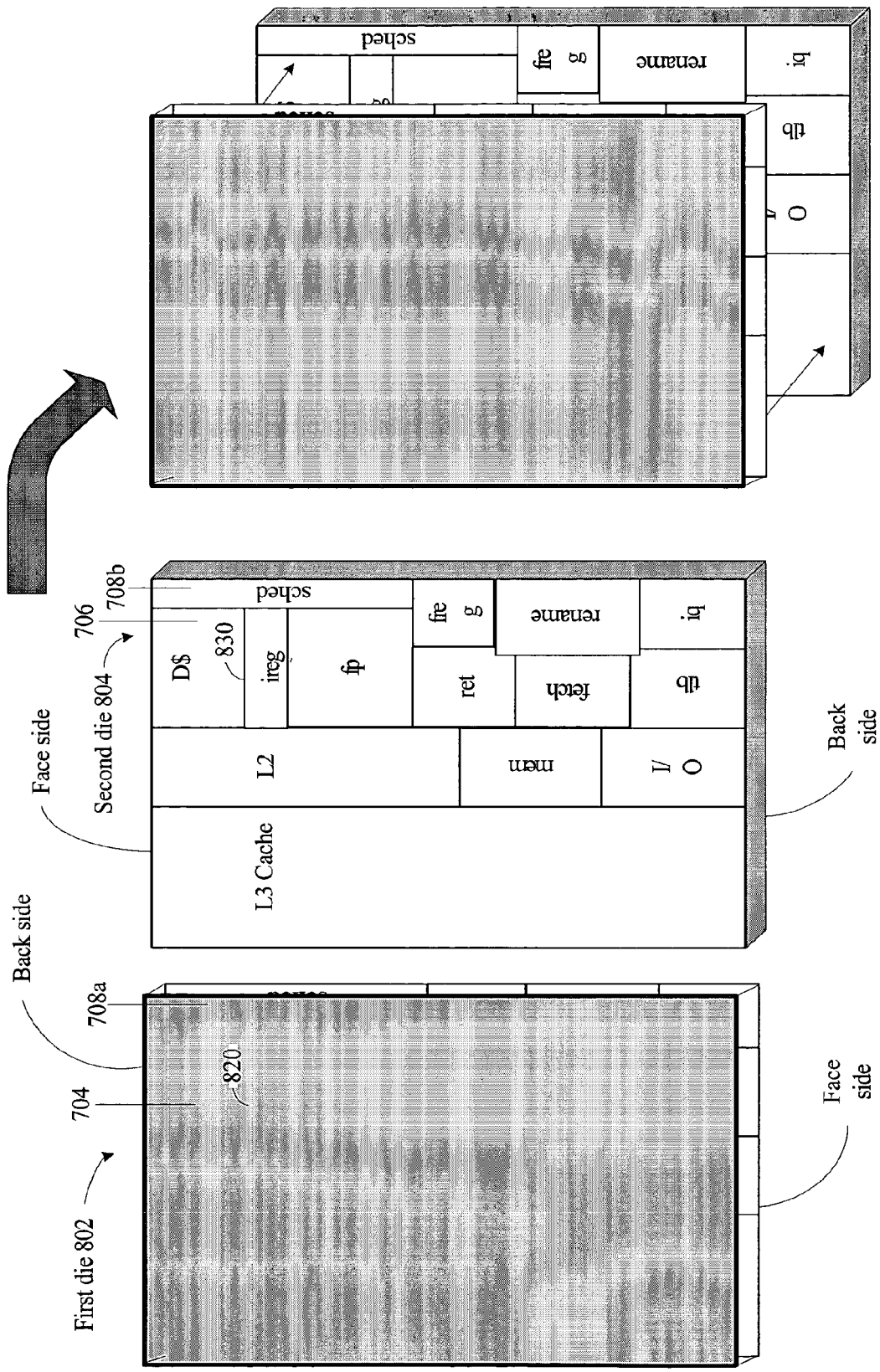
FIG. 8 is a block diagram illustrating at least one embodiment of partitioning and allocation of the logic illustrated in FIG. 7 between two face-to-face stacked dice.

FIG. 8 illustrates at least one embodiment of processor logic, such as the sample processor logic illustrated in FIG. 7, which has been allocated between two separate dice 802, 804. While a particular allocation of the logic is illustrated in FIG. 8, it should be understood that FIG. 8 is presented only for the general purpose of illustrating that instruction-processing logic for a processor may be split among two or more dice. The particular allocation of processor logic between the first and second dice 802, 804 as illustrated in FIG. 8 should not be taken to be limiting.

At least one allocation scheme for splitting processor logic between two dice 802, 804 may be designed, for example, to ameliorate power-density concerns. That is, processors often strive to achieve a current-per-region value that is at or lower than a predetermined threshold. A relatively high power-density region requires a relatively large amount of current. By allocating a portion of the logic for the high power-density region to a first die and the remaining portion of the logic for the high power-density region to a second die, the implementation constraints for the region may be relaxed, leading to a lower power-density design. This ability to partition the logic of a high power-density region to reduce its footprint and to lower its power consumption is only one advantage of the stacking approach illustrated in FIG. 8. As is explained immediately below, other advantages may also be realized from such an approach.

FIG. 8 illustrates that the instruction-processing logic of the scalar processor die 700 illustrated in FIG. 7 may be partitioned such that the execution logic 704 is partitioned to a first die 802 and the data cache 706 is partitioned to a second die 804. The execution logic 704 may be placed on the face side of the first die 802 and the data cache 706 may be placed on the face side of the second die 804. The data cache logic 706 and the execution logic 704 may further be partitioned such that, when the first die 802 is stacked on top of the second die 804, the data cache logic 706 overlaps the execution logic 704. For instance, the logic may be partitioned such that, when the two dice 802, 804 are stacked, the front edge 830 of the data cache 706 overlaps the front edge 820 of the execution logic 704.

Further partitioning of scalar processor logic is also illustrated in FIG. 8. For example, the scheduling logic 708 illustrated in FIG. 7 has been partitioned into two logic portions 708a and 708b that have been allocated to separate dice. In addition, FIG. 8 illustrates that an L3 cache may be partitioned among the two dice, as may be a memory controller ("mem"), an L2 cache, retirement logic ("ret"), integer register file ("ireg"), floating point register file ("freg"), input/output logic ("I/O"), fetch logic ("fetch"), floating point execution logic ("fp"), and instruction queue logic ("iq").

Figure 9:
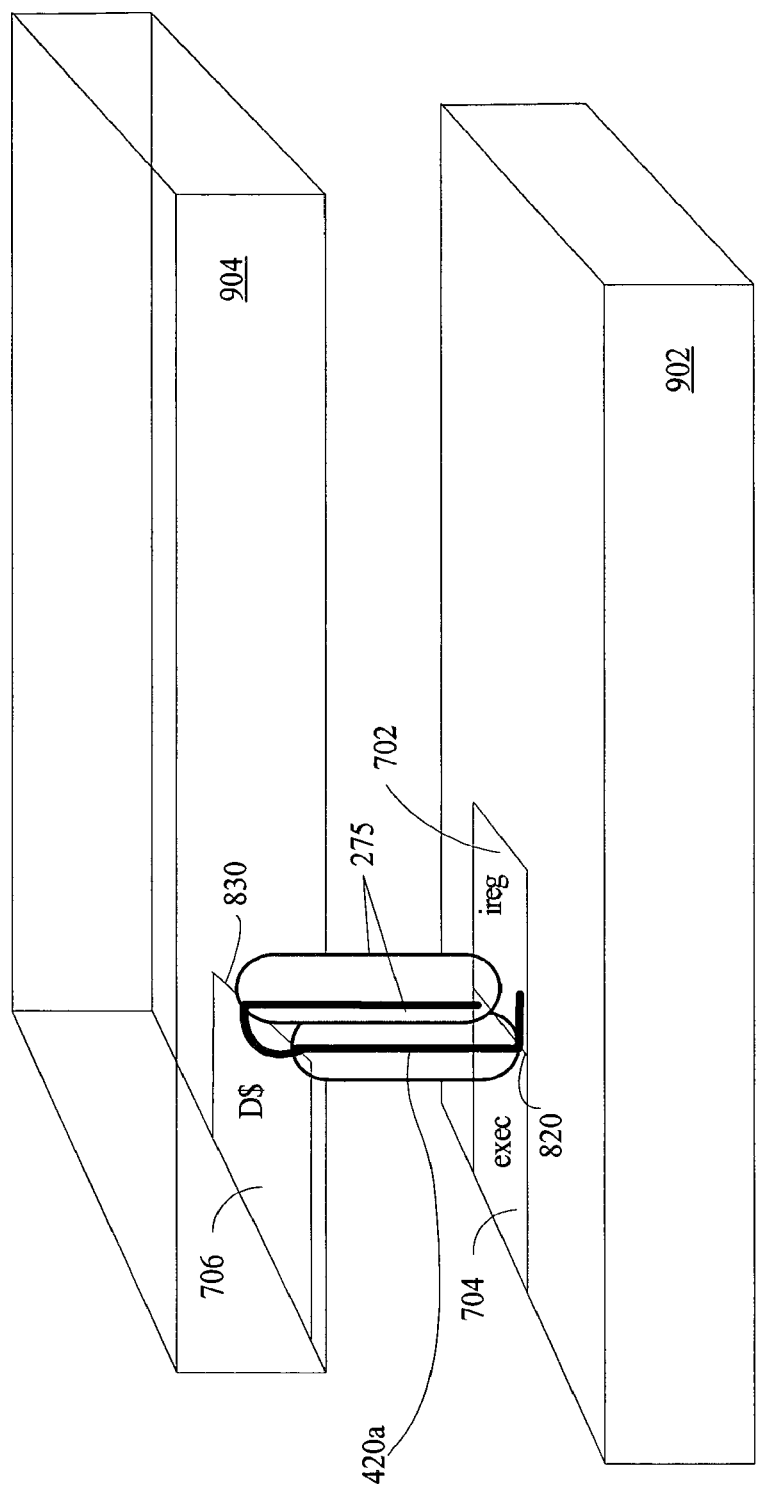
FIG. 9 is a plan view of a reduced-length load access data path for at least one embodiment of a multi-die processor.

Turning to FIG. 9, the new data path 420a for the load access loop 420 illustrated in FIGS. 4 and 7 is shorter and more time-efficient under the multi-die approach illustrated in FIG. 8. Specifically, FIG. 9 illustrates the load access data path 420 for an embodiment wherein the logic of a processor has been split such that the data cache 706 of a second die 904 overlaps the execution logic 704 on a first die 902 such that the front edge 830 of the data cache 706 overlaps the front edge 820 of the execution logic 704. (Although not so illustrated in FIG. 9, one of skill in the art will recognize that the general register file 702 may also be split between the two dice 902, 904, as illustrated, for example, in FIG. 8).

FIG. 9 illustrates that the new load access data path 420a is more efficient in that, after load data has been retrieved from the data cache 706, the data need not be transmitted along the full length of the execution logic 704 in order to arrive at the front edge 820 of the execution logic 704. Instead, the data may be transmitted directly to the front edge 820 of the execution logic 704 via the conductive intra-die interface 275. In this manner, the data need not take time to traverse the execution logic 704 and, thus, the time delay that to get the desired load data from the data cache 706 to the front of the execution logic 704 (see 730, FIG. 7) is avoided or reduced. Similar time delay reduction may be realized for the portion of the data path indicated by reference numeral 732 in FIG. 7.

The embodiment illustrated in FIG. 9 may also provide beneficial heat-management effects, in addition to the timing efficiency discussed above. That is, for at least some processor embodiments, the execution units in execution logic 704 represent relatively "hot" logic blocks. That is, they have significant internal transistor switching and therefore generate relatively more heat than other blocks. In contrast, for at least some embodiments a data cache 706 is a relatively "cool" logic block that does not generate as much heat as a "hot" block. Accordingly, the embodiment illustrated in FIG. 9 enjoys the additional benefit of stacking a "hot" block and a "cool" block such that they at least partially overlap. Such hot/cool stacking may minimize detrimental thermal effects that otherwise might ensue from stacking "hot" blocks in a multi-die processor such that they overlap each other. That is, the cool block may effectively be used as a heat sink to dissipate heat from the hot block.

Figure 10:
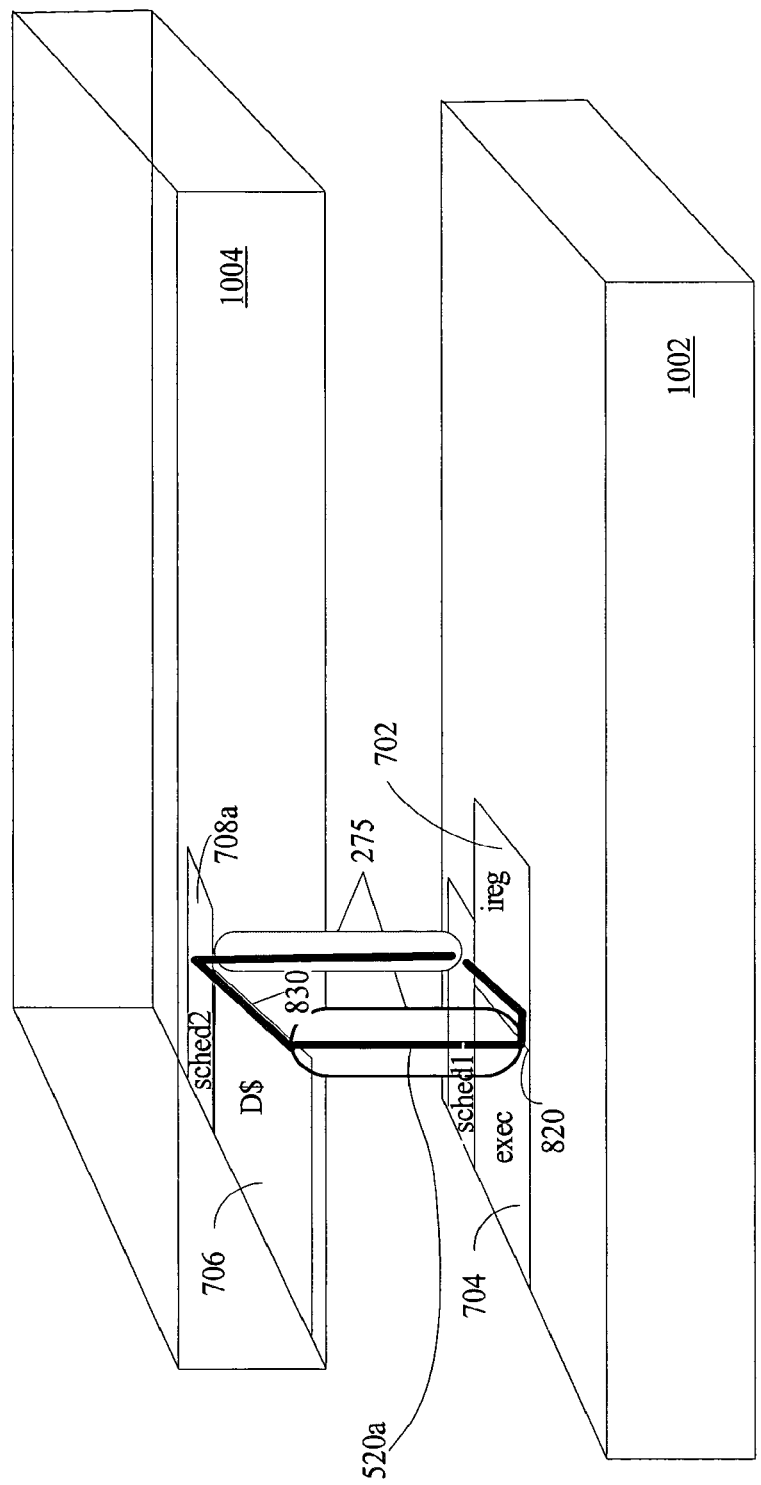
FIG. 10 is a plan view of a reduced-length schedule-execute data path for at least one embodiment of a multi-die processor.

FIG. 10 illustrates that the partitioning of the scheduling logic 708 into two portions 708a, 708b that are each allocated to different dice 1002, 1004 may also result in efficiencies for the schedule-execute data path 520 illustrated in FIGS. 5 and 7. FIG. 10 illustrates that the new schedule-execute data path 520a also enjoys the efficiency of die-to-die communication through the intra-die interface 275. Each of the intra-die communications involves only the time involved with communicating through the die-to-die interface 275 between logic elements 708a and 708b, 704 and 706 that overlap each other.

Figure 11:
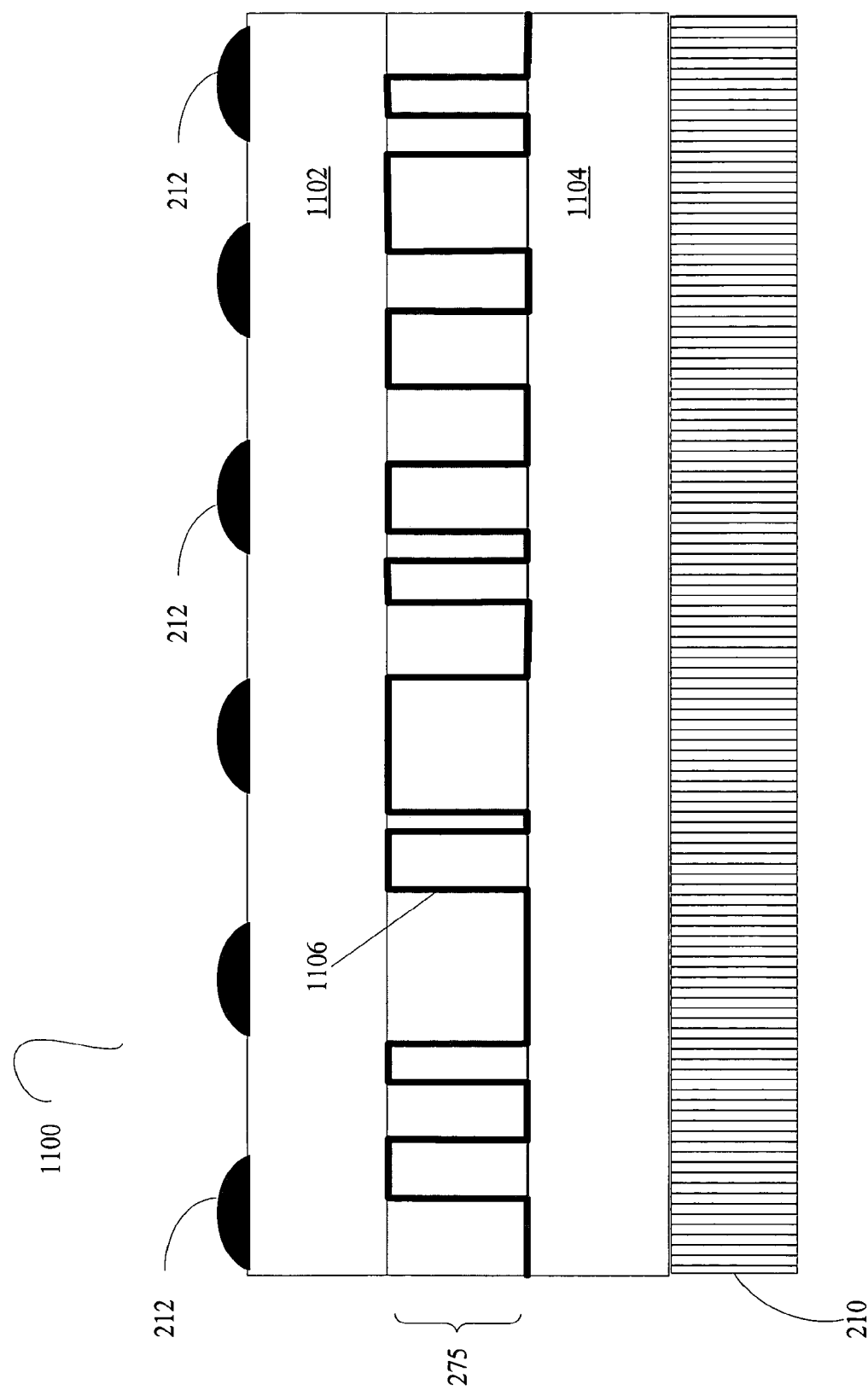
FIG. 11 is a block diagram illustrating a zigzag data path among blocks of processor logic partitioned between two face-to-face stacked dice according to at least one embodiment.

FIG. 11 illustrates an embodiment of a multi-die processor 1100 that has been partitioned such that logic portions for the stages 302, 304, 306, 308, 312, 313, 314 of an execution pipeline 300 (see, e.g., FIG. 3) have been allocated between two die 1102, 1104. The logic for the pipeline stages have been allocated between the two die 1102, 1104 such that communication signals for the pipeline follows a zigzag path 1106 between the first die 1102 and the second die 1104 via the die-to-die interface 275 to access the allocated portions of the pipeline state logic. This type of allocation may be advantageous in some embodiments because the die-to-die communications along the zigzag path are more efficient in that they may reduce path length and therefore improve performance.

Additionally, FIG. 11 illustrates that at least one embodiment 1100 of a multi-die processor may include I/O bumps 212 and a heat sink 210, as is discussed above.

Figure 12:
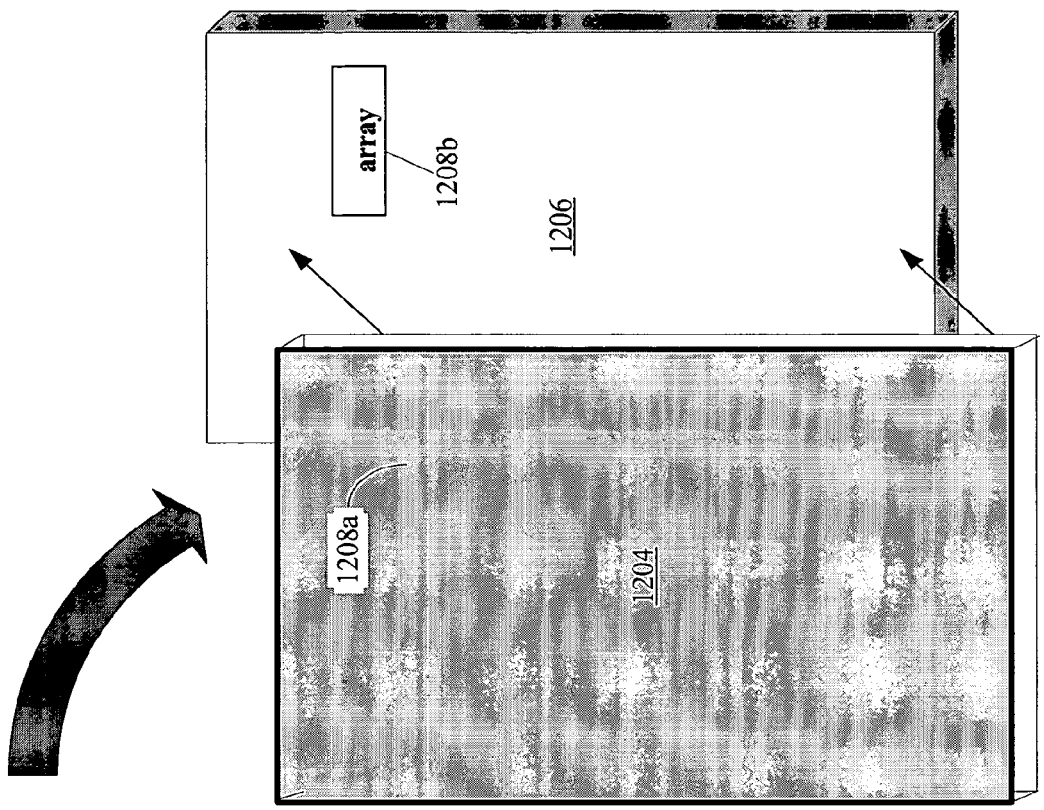
FIG. 12 is a block diagram illustrating at least one embodiment of a split array partitioned between two face-to-face stacked dice.
Figure 12:
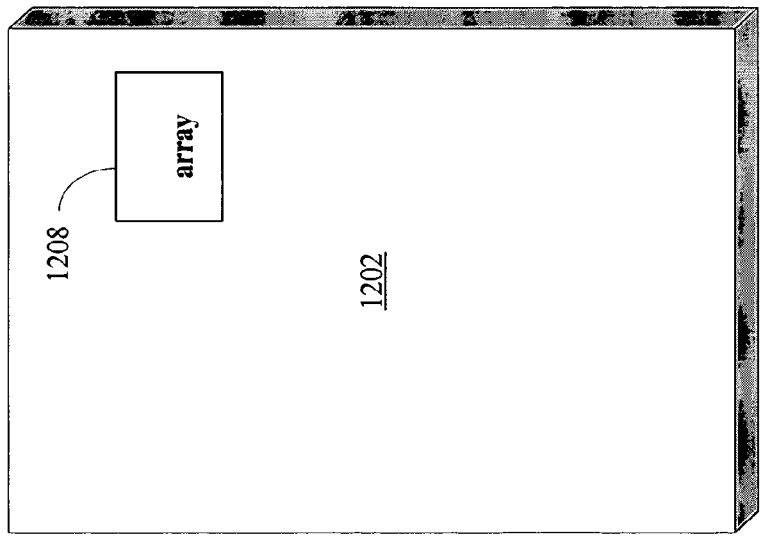

FIG. 12 illustrates at least one embodiment of a multi-die processor wherein an array 1208 of a scalar floor plan 1200 is split and allocated between two dice 1202, 1204. The array 1208 may be any array, including a general register file, a cache, a floating point register file, or a microcode ROM (read-only memory). FIG. 12 illustrates that the array may be split into a first portion 1208a and a second portion 1208b that may each be allocated to a different die 1202, 1204. When the two die 1202, 1204 are stacked, the two logic portions 1208a, 1208b may at least partially overlap. In such manner, the array access time may be decreased by utilizing the die-to-die interface (see 275, FIG. 2) to facilitate communication between the overlapping portions 1208a, 1208b because the total length of the array is reduced. This may be advantageous in some embodiments, for example, where the array is a register file array in order to reduce the total worst-case transfer time between registers.

It should be noted, of course, that the two portions 1208a, 1208b may, but need not necessarily, completely overlap each other. For instance, in order to offset potential thermal effects that may be associated with overlapping portions of "hot" processor logic blocks over each other, the overlapping portions may be offset such that only part of the portions 1208a, 1208b overlap each other.

Figure 13:
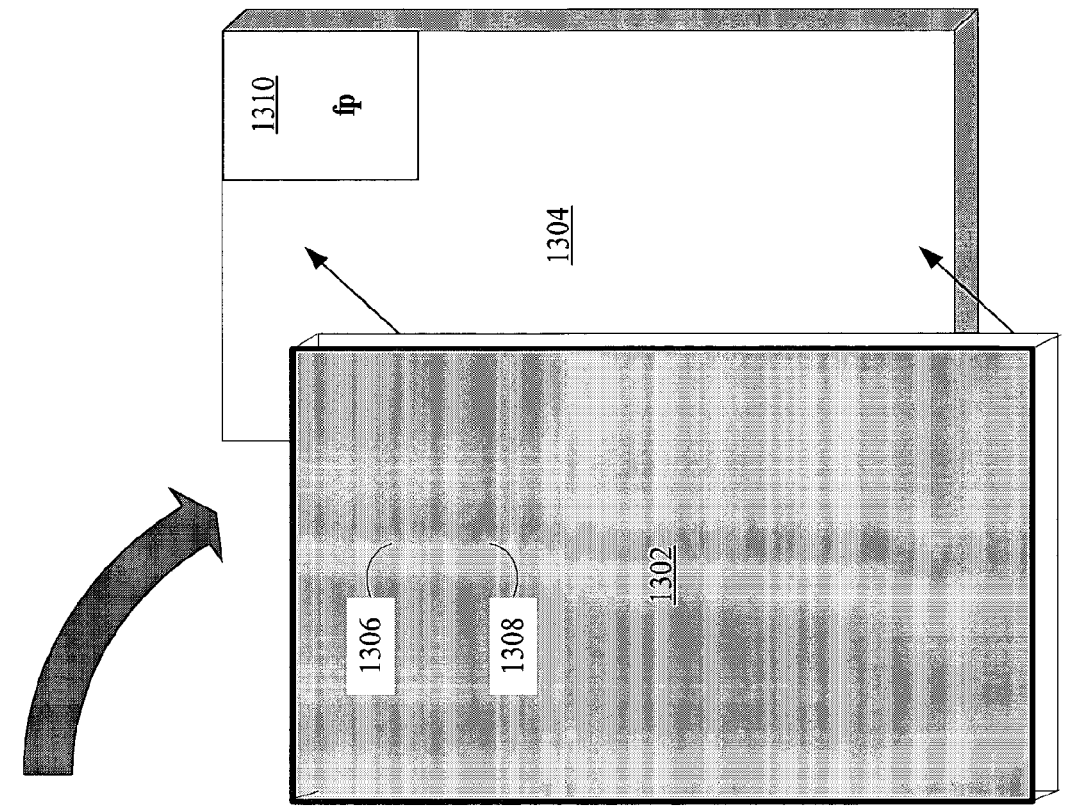
FIG. 13 is a block diagram of at least one embodiment of split execution logic partitioned between two face-to-face stacked dice.
Figure 13:
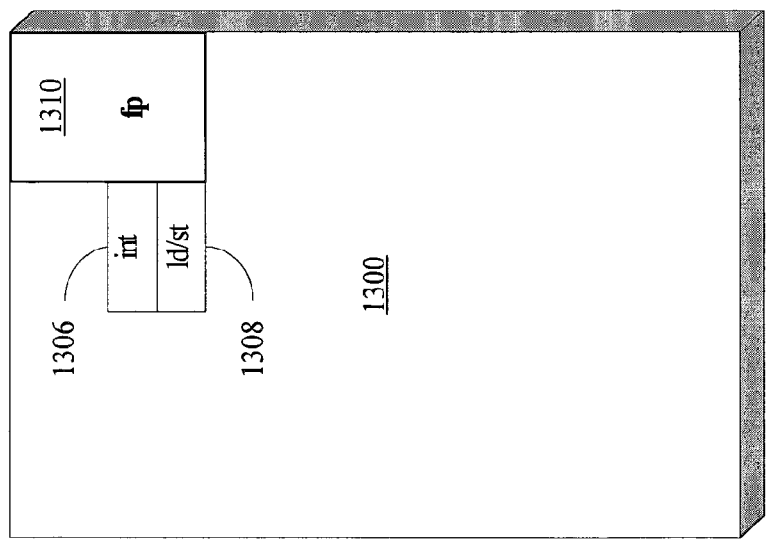

FIG. 13 illustrates at least one other embodiment of a multi-die processor layout. FIG. 13 illustrates that a floor plan for a scalar processor 1300 includes an integer execution unit 1306, a load/store execution unit 1308, and a floating point execution unit 1310. The execution unit logic blocks 1306, 1308 and 1310 may be allocated between the face sides of two dice, 1302 and 1304. FIG. 13 illustrates that the execution unit logic blocks 1306, 1308, 1310 may be allocated such that the integer execution unit 1306 and load/store execution unit 1308 are allocated to a first die 1302 and the floating point execution unit 1310 may be allocated to a second die 1304 such that they at least partially overlap each other when the first die 1302 and second die 1304 are stacked. This type of allocation may be advantageous in some embodiments at least because splitting the execution units 1306, 1308, 1310 between the two dice 1302, 1304 allows up to twice the transistor density for the execution units and therefore may improve performance by shortening path length delay.

Figure 14:
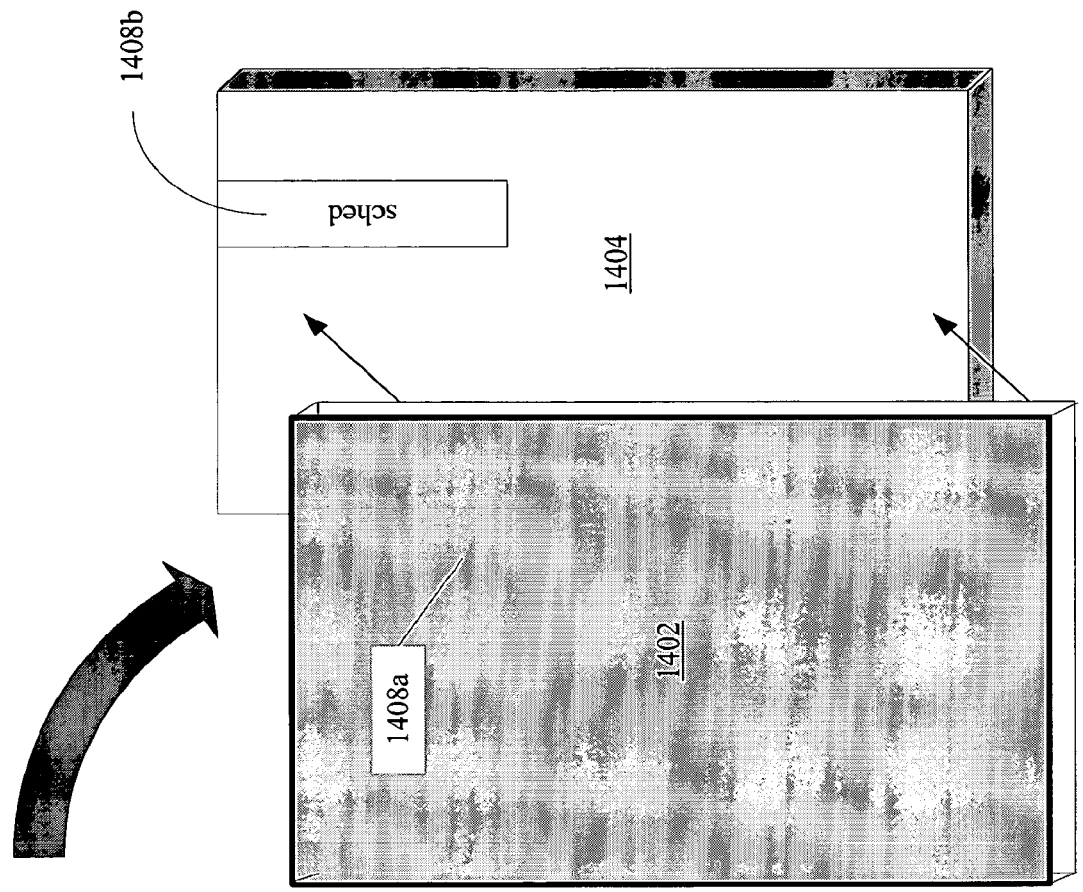
FIG. 14 is a block diagram of at least one embodiment of split scheduling logic partitioned between two face-to-face stacked dice.
Figure 14:
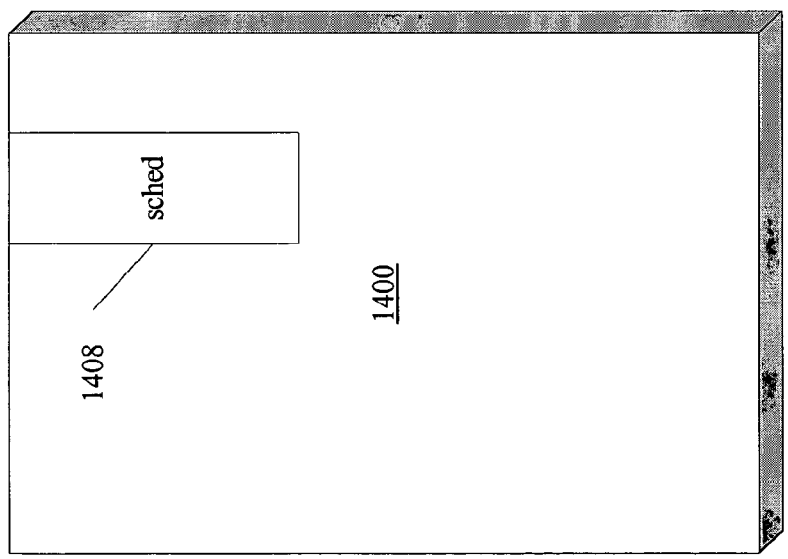

FIG. 14 illustrates at least one other embodiment of a multi-die processor layout. FIG. 14 illustrates that a floor plan for a scalar processor 1400 includes scheduling logic 1408. The scheduling logic 1408 may be partitioned into two logic portions, 1408a and 1408b. The scheduling logic 1408 may be partitioned, for example, into an arithmetic scheduling portion 1408a and a memory request scheduling portion 1408b. The two logic portions 1408a and 1408b may be partitioned between a first die 1402 and a second die 1404, respectively, such that they at least partially overlap each other when the first die 1402 and second die 1404 are stacked. Such overlapping portions may operate to cooperatively accomplish scheduling operations for execution of an instruction. This type of allocation may be advantageous in some embodiments at least because signal bandwidth for the scheduling logic 1408 may be increased. Accordingly, it enhances performance by allowing more than one signal to be transmitted between the scheduling portions 1408a, 1408b concurrently.

Figure 15:
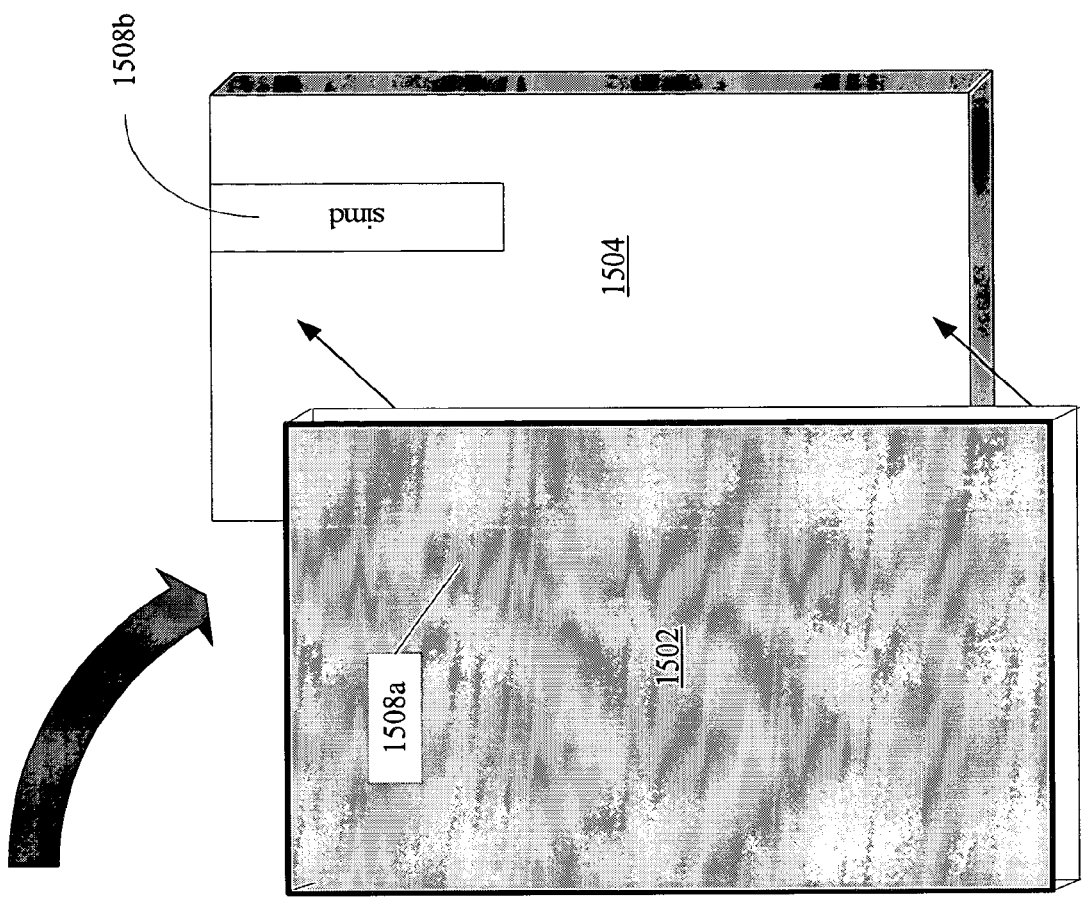
FIG. 15 is a block diagram of at least one embodiment of split floating point execution logic partitioned between two face-to-face stacked dice.
Figure 15:
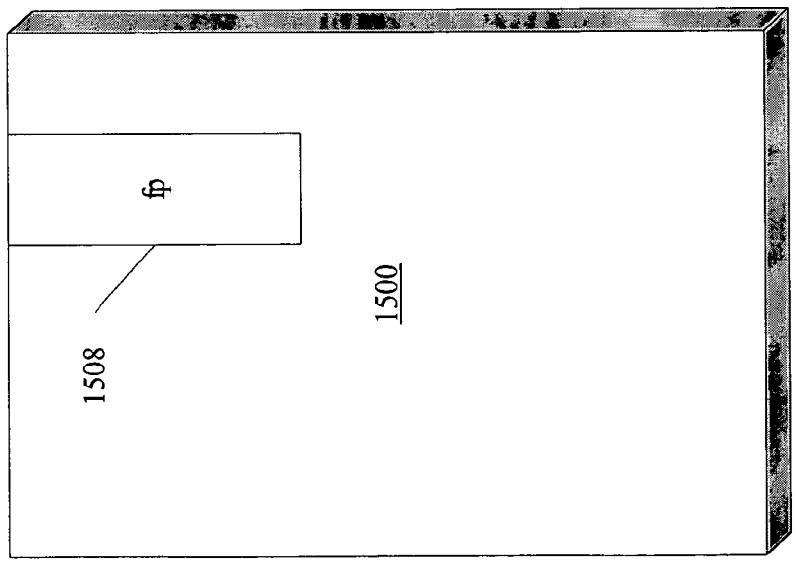

FIG. 15 illustrates at least one other embodiment of a multi-die processor layout. FIG. 15 illustrates that a floor plan for a scalar processor 1500 includes floating point execution logic 1508. The floating point execution logic 1508 may be partitioned into two logic portions, 1508a and 1508b. The logic 1508 may be partitioned, for example, into a non-SIMD (single-instruction-multiple-data) floating point execution logic potion 1508a and a SIMD floating point execution logic portion 1508b. The two logic portions 1508a and 1508b may be partitioned between a first die 1502 and a second die 1504, respectively, such that they at least partially overlap each other when the first die 1502 and second die 1504 are stacked. This type of allocation may be advantageous in some embodiments at least for those reasons, discussed above, related to increased transistor density and increased signal bandwidth.

Figure 16:
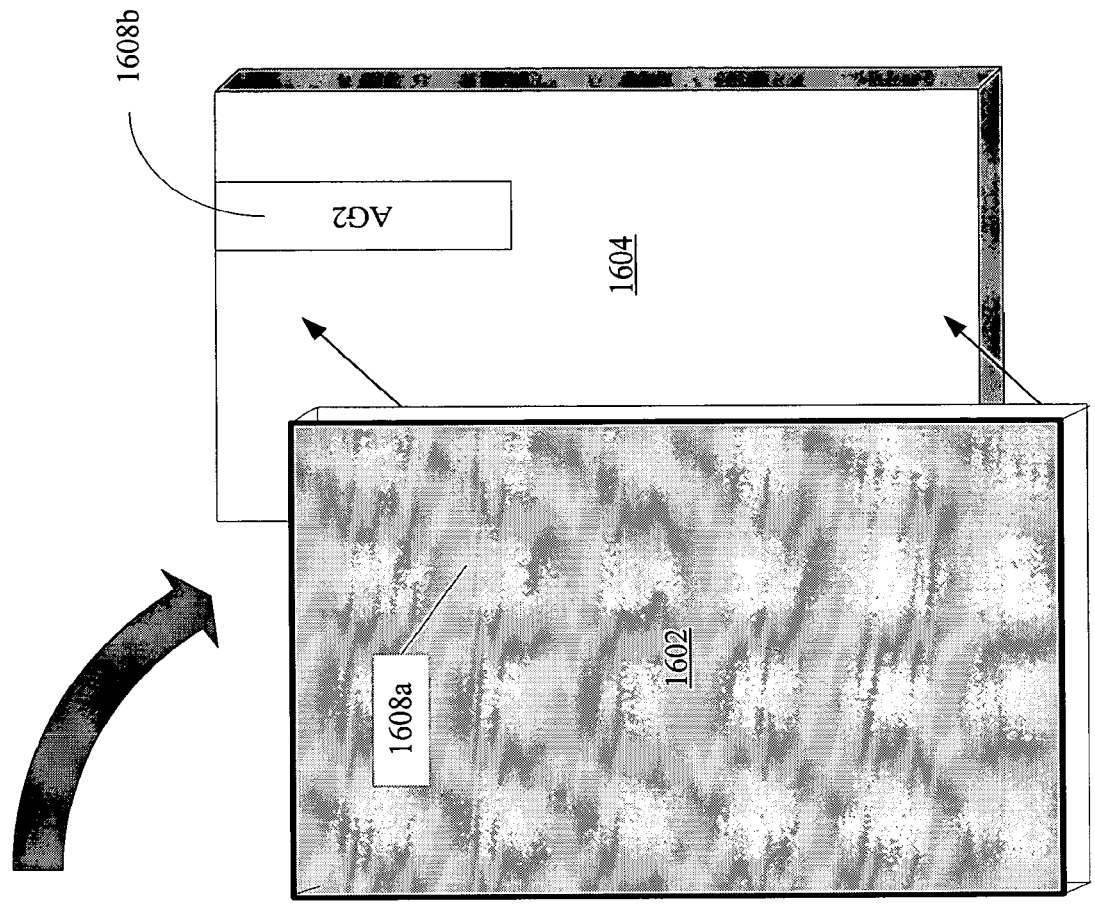
FIG. 16 is a block diagram of at least one embodiment of split address generation logic partitioned between two face-to-face stacked dice.
Figure 16:
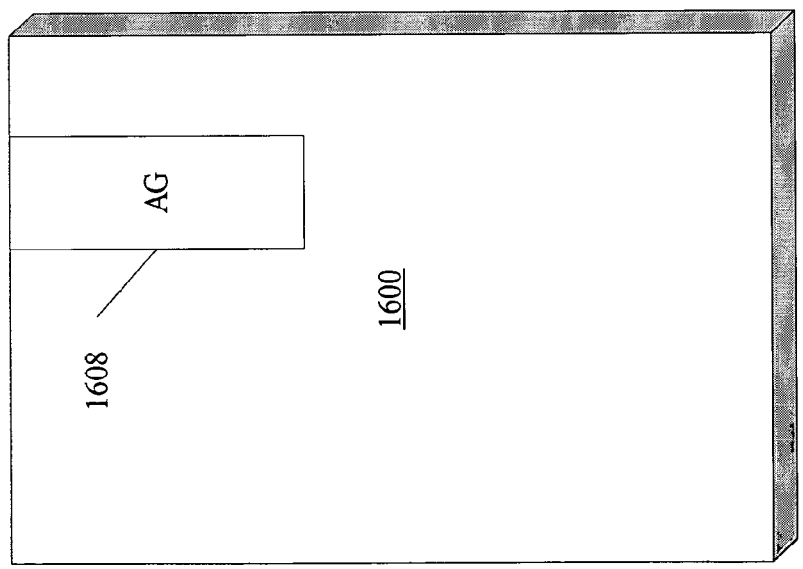

FIG. 16 illustrates at least one other embodiment of a multi-die processor layout. FIG. 16 illustrates that a floor plan for a scalar processor 1600 includes address generation 1608. The address generation logic 1608 may be partitioned into two logic portions, 1608a and 1608b. The two logic portions 1608a and 1608b may be partitioned between a first die 1602 and a second die 1604, respectively, such that they at least partially overlap each other when the first die 1602 and second die 1604 are stacked. Again, this type of allocation may be advantageous in some embodiments at least for those reasons, discussed above, related to increased transistor density and increased signal bandwidth.

While FIGS. 8-16 illustrate various embodiments of a multi-die processor wherein the instruction-processing logic of the processor is allocated among two die, such embodiments are provided for illustrative purposes and should not be taken to be limiting. For example, any one or more of the particular partitioning and/or allocation embodiments illustrated in FIGS. 8-16 may be practiced alone, or in conjunction with other such embodiments. That is, in a single multi-die processor the partitioning illustrated in FIG. 9, for instance, may be practiced along with the partitioning illustrated in FIGS. 12, 13, 14, 15 and/or 16.

Also for example, while the illustrated embodiments indicate a two-die processor, with each die having a logic portion of the processor disposed thereon, the logic of a processor may be partitioned among a plurality of dice. For example, face-to-face die may overlap such that a portion of a first top die and a portion of a second top die overlap a third bottom die. The partitioned logic on the multiple dice, whatever the number, cooperatively operates to execute one or more instructions.

That is, as disclosed herein the logic portions allocated to respective multiple dice may be invoked to perform one or more execution operations associated with an instruction. The logic portions operate to cooperatively accomplish execution operations, such as those operations indicated for an execution pipeline (see, for example, sample pipeline 300 illustrated in FIG. 3). These execution operations may include, but are not limited, address generation, instruction pointer generation, fetching instructions, decoding instructions into micro-operations, renaming registers to eliminate certain types of data dependencies, dispatch, scheduling, execution, and retirement. As such, the execution operations may include sub-instruction level tasks performed in response to an instruction.

The logic portions may be allocated among the multiple dice such that certain functions are split. That is, address generation unit logic may be split into a first portion and a second portion, with the first portion being allocated to a first die and a second portion being allocated to a second die. The first and second logic portions may at least partially overlap and may act together to cooperatively perform the operations of an address generation unit. Similarly, a scheduling unit may be split, as may an array such as a general register file, a cache, a floating point register file or a microcode memory array. A memory controller may also be split, as may a cache, a translation lookaside buffer, decode logic, rename logic, fetch logic, retirement logic, and floating point execution unit logic.

As is indicated above, logic portions may also be allocated such that, rather splitting a block of logic, the intact logic blocks for successive pipeline stages are allocated among the multiple dice of the processor. Such allocation of the logic for pipeline stages may result in a zigzag communication path 1106 through the die-to-die interface 275 as illustrated in FIG. 11.

The execution operations associated with an execution stage of an execution pipeline may further include execution, by an execution unit, of arithmetic instruction codes such as integer or floating point instruction codes. As used herein, the term "instruction code" is intended to encompass any unit of work that can be understood and executed by an execution unit, such as a floating point execution unit, arithmetic logic unit, or load/store execution unit. An instruction code may be a micro-operation.

The execution operations associated with the execution pipeline stage may also include execution, by an execution unit, of a memory instruction code such as a memory read or memory write instruction code.

The foregoing discussion discloses selected embodiments of a multi-die processor. A multi-die processor 1702 such as described herein may be utilized on a processing system such as the processing system 1700 illustrated in FIG. 17. System 1700, may be used, for example, to execute one or more instructions of an instruction set. For purposes of this disclosure, a processing system includes any processing system that has a processor, such as, for example; a digital signal processor (DSP), a microcontroller, an application specific integrated circuit (ASIC), or a microprocessor, where such processor is a multi-die processor as described in the embodiments discussed above. The processing system 1700 is representative of processing systems based on the Itanium® and Itanium® 2 microprocessors as well as the Pentium®, Pentium® Pro, Pentium® II, Pentium® III, and Pentium® 4 microprocessors, all of which are available from Intel Corporation. Other systems (including personal computers (PCs) having other microprocessors, engineering workstations, personal digital assistants and other hand-held devices, set-top boxes and the like) may also be used. At least one embodiment of system 1700 may execute a version of the Windows™ operating system available from Microsoft Corporation, although other operating systems and graphical user interfaces, for example, may also be used.

Processing system 1700 includes a memory system 1705 and a processor 1702. Memory system 1705 may store instructions 1740 and data 1741 for controlling the operation of the processor 1702. Memory system 1705 is intended as a generalized representation of memory and may include a variety of forms of memory, such as a hard drive, CD-ROM, random access memory (RAM), dynamic random access memory (DRAM), static random access memory (SRAM), flash memory and related circuitry. Memory system 1705 may store instructions 1740 and/or data 1741 represented by data signals that may be executed by the processor 1702.

The processing system 1700 includes an interface portion 1704. Rather than the die-to-die interface 275 between the first die 102 and second die 104 of the processor 1702, the interface portion 1704 may be coupled to only one or both of the dice 102, 104. The interface portion 1704 is to generate inter-component signals between the processor 1702 and another component of the system 1700. For example, the interface portion 1704 may generate inter-component signals between the processor 1702 and the memory system 1705. For instance, the interface portion 1704 may generate signals between the processor 1702 and memory system 1705 in order to perform a memory transaction such as a data-retrieval read operation from memory or a data write to memory. The interface portion 1704 may also generate signals between the processor 1702 and another system component 1707, such as an RF unit, keyboard, external memory device, monitor, mouse or the like.

In the preceding description, various aspects of an apparatus and system for a multi-die processor are disclosed. For purposes of explanation, specific numbers, examples, systems and configurations were set forth in order to provide a more thorough understanding. However, it is apparent to one skilled in the art that the described apparatus and system may be practiced without the specific details. It will be obvious to those skilled in the art that changes and modifications can be made without departing from the present invention in its broader aspects. While particular embodiments of the present invention have been shown and described, the appended claims are to encompass within their scope all such changes and modifications that fall within the true scope of the present invention.

What is claimed is:

1. An apparatus comprising:
   a first die including a first stage of a schedule logic of an execution pipeline of a processor logic to perform a first scheduling operation for an instruction;
   a second die including a second stage of the schedule logic of the execution pipeline to perform a second scheduling operation for the instruction in response to the first stage of the schedule logic performing the first scheduling operation; and
   a coupling interface to couple the first stage of the schedule logic to the second stage of the schedule logic.

2. The apparatus of claim 1, wherein the second die further includes a first portion of an execution logic to perform an execution operation in response to the first and second scheduling operations.

3. The apparatus of claim 1, wherein the first die further includes a fetch logic to perform a fetch operation and the second die includes a decode logic to perform a decode operation.

4. The apparatus of claim 1, wherein the first die includes a first instruction pipeline logic to perform a first instruction pipeline stage operation and the second die includes a second instruction pipeline logic to perform a second instruction pipeline stage operation.

5. The apparatus of claim 1, wherein a first stage of the execution pipeline configured on the first die and a second stage of the execution pipeline configured on the second die are contiguous stages of the execution pipeline.

6. The apparatus of claim 1, wherein a first stage of the execution pipeline configured on the first die and a second stage of the execution pipeline configured on the second die are not contiguous stages of the execution pipeline.

7. The apparatus of claim 1, wherein the first stage of the schedule logic is to perform memory scheduling for the instruction, and the second stage of the schedule logic is to perform arithmetic scheduling for the instruction.

8. The apparatus of claim 2, wherein the first die further includes a second portion of the execution logic to perform an execution operation in response to the first and second scheduling operations.

9. The apparatus of claim 2, wherein the execution logic is to perform an execution operation and the second die further includes a memory access logic to perform a memory access operation.

10. The apparatus of claim 6, wherein the first die includes register renaming logic to perform a register renaming operation and the second die includes retirement logic to perform a retirement operation.

11. The apparatus of claim 9, wherein the first die includes an instruction pointer generation logic to perform an instruction pointer generation operation and the second die includes a fetch logic to perform a fetch operation.

12. A processor package comprising:
   a first die including first portions of an execution pipeline of a processor core; and
   a second die including second portions of the execution pipeline of the processor core, wherein a data path of the execution pipeline zigzags between the first and second die such that an output of a first logic of the execution pipeline is communicated from the first die to a second logic of the execution pipeline on the second die and an output of the second logic is communicated from the second die to a third logic of the execution pipeline on the first die.

13. The processor package of claim 12, wherein a face side of the first die is coupled to a face side of the second die in a face-to-face configuration via a plurality of conductive elements.

14. The processor package of claim 12, wherein the first die includes an execution logic of the execution pipeline and the second die includes a data cache to provide data to the execution logic.

15. The processor package of claim 12, wherein the first die includes a first portion of an execution logic of the execution pipeline and the second die includes a second portion of the execution logic of the execution pipeline.

16. The processor package of claim 15, wherein the first portion of the execution logic includes an integer execution unit to execute integer instructions, and the second portion of the execution logic includes a floating point execution unit to execute floating point instructions.

* * * * *